United States Patent [19]

Leidich

[11] 4,172,999
[45] Oct. 30, 1979

[54] SELF-BIASING AMPLIFIER STAGE

[75] Inventor: Arthur J. Leidich, Flemington, N.J.

[73] Assignee: RCA Corporation, New York, N.Y.

[21] Appl. No.: 949,673

[22] Filed: Oct. 10, 1978

[51] Int. Cl.² ............................................. H03F 3/45
[52] U.S. Cl. .................................. 330/257; 330/261; 330/288; 330/296
[58] Field of Search ............... 330/257, 288, 261, 296

[56] References Cited
U.S. PATENT DOCUMENTS

| | | | |
|---|---|---|---|
| 3,781,699 | 12/1973 | Sakamoto | 330/260 |
| 3,872,392 | 3/1975 | Sakamoto et al. | 330/290 |
| 4,077,012 | 1/1977 | Iwamatsu | 330/253 |
| 4,088,962 | 5/1978 | Trilling | 330/261 |

*Primary Examiner*—Lawrence J. Dahl
*Attorney, Agent, or Firm*—H. Christoffersen; A. L. Limberg; E. P. Herrmann

[57] ABSTRACT

A self-biasing amplifier stage including a first transistor arranged as a common emitter amplifier. A current amplifier is connected for receiving collector current from the first transistor responsive to which an output current is provided which is differentially summed with a constant current. The resultant difference current is integrated to generate a potential which potential is applied via a potential follower to the emitter electrode of the first transistor to adjust the current therethrough.

12 Claims, 3 Drawing Figures

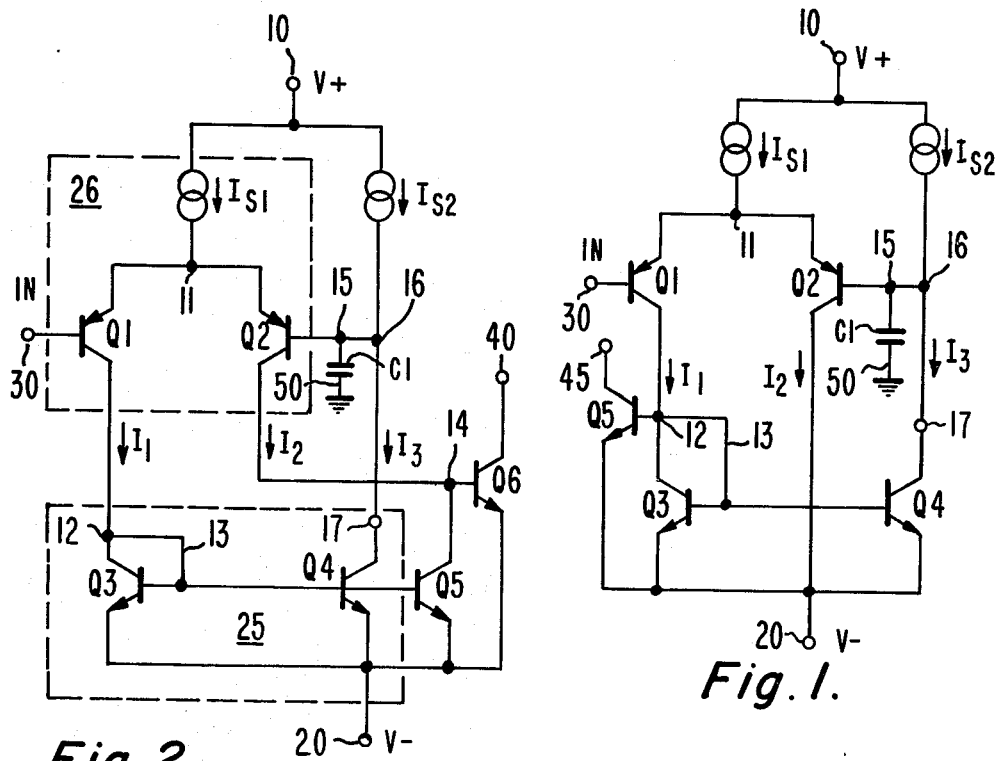
Fig. 1.
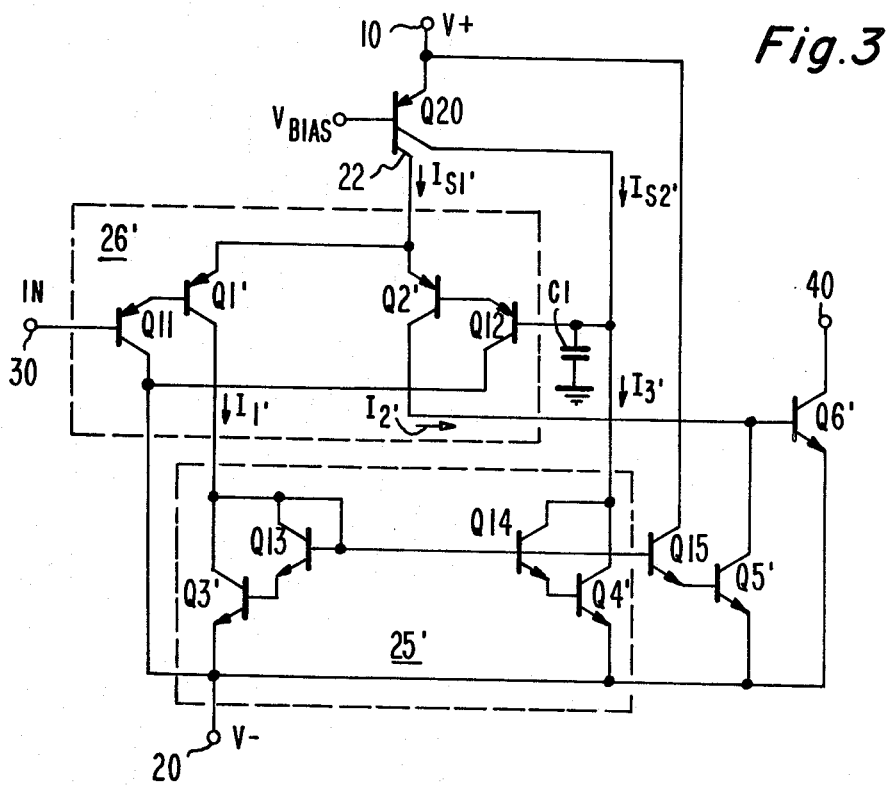
Fig. 2.
Fig. 3.

SELF-BIASING AMPLIFIER STAGE

The present invention relates to transistor amplifiers that are operable over a wide range of quiescent input potentials.

It is often desirable to obtain the high-gain of a common-emitter amplifier transistor in a situation where the input signals are superimposed on a quiescent potential that may be of a range of values, and where it is impractical to use reactive coupling to separate the signal from the quiescent potential. Simple capacitive coupling is not satisfactory in such circumstances because of the tendency of the coupling capacitor to charge up on peaks of signal that bias the transistor more heavily into conduction, owing to the rectifying characteristic of a transistor base-emitter junction. This charging occurs unless the associated biasing resistance is of the same relative magnitude as the transistor base impedance, which undesirably increases the size of the coupling capacitor required to realize response at lower frequencies.

The present invention concerns an amplifier stage using frequency-selective filtering to discard the quiescent potential accompanying a signal being amplified while at the same time avoiding the build-up of undesirable charge on any capacitive element used in the frequency-selective filtering. To this end a different reactive element is used for frequency-selective filtering, arranged in the integrator means of a direct coupled feedback network as a by-pass element for signal variations. The amplifier stage maintains a quiescent output potential which is substantially constant and independent of the quiescent input potential.

Such an amplifier stage finds utility as the input stage of a general purpose single-ended amplifier which may be direct coupled to a variety of different signal sources having a range of quiescent potentials, rendering unnecessary the need to adjust the amplifier for different quiescent input potentials or supply potentials. The amplifier stage is equally well suited as an intermediate or output stage of a cascaded amplifier wherein its self biasing characteristics tend to reduce the effects of slowly varying internal quiescent potentials due to temperature changes for example, with the net effect of increasing the dynamic range of the overall amplifier.

More particularly, an amplifier of the following type embodies the present invention. A first transistor, which may be a bipolar device or a field effect device but which will be described in terms of a bipolar device, has its emitter electrode connected to the output of a first substantially constant current source for receiving emitter current, and its base electrode connected for receiving signal potential. A potential follower has its output terminal connected to the interconnection of the emitter electrode of the first transistor and the first current source, for regulating the potential thereat and establishing an operating point for the first transistor that is substantially independent of the quiescent input potential. The potential follower is responsive to a potential established by integrating a difference current on an integrating capacitor, the difference current being derived from the differential summing of current from a second constant current source and the output current from a current mirror amplifier connected for receiving, and responsive to, current conducted in the collector-emitter circuit of the first transistor. Insofar as the collector current of the first transistor differs from its prescribed quiescent level a difference current will be applied to the integrating capacitor to adjust the potential applied to the input circuit of the potential follower to restore the circuit to its quiescent current operating point regardless of the quiescent potential applied to the base electrode of the first transistor.

In the drawings:

FIG. 1 is a schematic diagram of a self-biased pulse amplifier embodying the present invention.

FIGS. 2 and 3 are schematic diagrams of self-biased linear or pulsed amplifiers embodying the present invention.

In FIG. 1, transistor Q1 having its emitter electrode connected at node 11 is essentially arranged as a common-emitter amplifier having degeneration impedance in its emitter circuit, which impedance includes the parallel combination of current source $I_{S1}$, and the impedance looking into the emitter of transistor Q2. Input signal is applied to the base of Q1 via terminal 30, and Q1 is supplied emitter current by constant source $I_{S1}$. The amplitude of the current conducted in the emitter electrode of Q1 is exponentially related to the potential appearing across its base-emitter junction located between terminal 30 and node 11. The current $I_{S1}$ supplied by source $I_{S1}$ to node 11 is chosen to exceed the quiescent current conducted by the emitter electrode of Q1, the ratio of current $I_{S1}$ to the emitter current of Q1 being established with regard to the desired operating point of Q1 and with regard to the particular application of the amplifier, e.g., linear versus digital or pulsed applications.

Transistors Q3 and Q4 are arranged as a current mirror amplifier or CMA having an input connection at node 12 for receiving input current $I_1$ and an output at terminal 17 for applying output current $I_3$. Q3, the master mirroring transistor, having a feedback connection between its collector and base electrodes develops a base-emitter potential commensurate with the input current conducted in its collector-emitter circuit. Q4, the slave mirroring transistor, connected to have the base-emitter potential developed by Q3 applied to its base-emitter junction, develops an output current related to the input current by a gain factor G such that $I_3 = -GI_1$. The gain factor G is determined by the ratio of the areas of the base-emitter junctions of Q4 to Q3 supposing Q4 and Q3 to have similar doping profiles.

The collector electrode of transistor Q1 connected to circuit node 12 supplies current $I_1$ to the input connection of the CMA. The CMA responds to $I_1$ to withdraw an output current $I_3 = GI_1$ from node 16 where it is differentially summed with constant current supplied to node 16 from current source $I_{S2}$. The resultant difference current from the summing point at node 16 is applied to node 15 where it is integrated by integrating capacitor C1 connected between node 15 and point of fixed potential 50, generating a potential $V_B$ at node 15 respective to ground. The potential $V_B$ is related to the electric charge, Q, residing on $C_1$, i.e., $V_B = Q/C_1$ and the charge is the time integral of current applied to $C_1$. $V_B$ is applied via the emitter follower action of Q2 with a translation equal to the base-emitter offset potential of Q2 to the emitter electrode of Q1, completing a feedback loop that regulates the quiescent value of $I_3$ to equal $I_{S2}$ (except for the base current of Q2, presumed to be negligibly small), whereby the quiescent value of $I_1$ is indirectly regulated to be substantially equal to $I_{S2}/G$.

Changes $\Delta V_B$ in potential $V_B$ result from a tendency for the average Q1 collector current $I_1$ to change from its prescribed value which tends to cause the CMA output current $I_3$ to differ from $I_{S2}$. This in turn causes a difference current to be applied to node 15 and to be integrated on C1.

The $\Delta V_B$ changes are always of such polarity to restore $I_1$ to its prescribed quiescent value. Once $I_1$ is restored to its quiescent value, $V_B$ remains at the new potential value, which potential is essentially equal to the value of the d.c. component of potential applied to input terminal 30, and the difference current is zero. The average or quiescent value of $I_1$ remains constant for varying input potentials below the lower frequency limit of the amplifier and for a wide range of d.c. potentials applied at 30. As a consequence, where the amplifier output signal is derived from $I_1$, no undesirable response to the input d.c. component accompanies the output signal.

The potential $V_B$ across C1 cannot change abruptly and as the applied difference current alternates in polarity the potential tends to assume an average value relative to the variations of difference current. Further, since the difference current is derived from two high-impedance sources, $I_{S2}$ and the CMA output, the potential at node 15 is substantially free to vary according to the integrated charge, between the supply potentials V+ and V− applied to terminals 10 and 20 respectively.

The feedback mechanism provided by the potential follower is not responsive to rapidly varying signals due to the integration of the difference current by $C_1$. The lower frequency, $F_L$, of response of the amplifier stage is established by the size of $C_1$, i.e., $f_L = I_2/(C_1 \Delta V_B)$ where $f_L$ is in Hertz. Implicit in this formulation is that the charge and discharge rates of $C_1$ are equal.

In FIG. 1 the output signal from the amplifier stage is available at terminal 45 connected to the collector electrode of transistor Q5. Transistor Q5 having its base and emitter electrodes respectively at node 12 and terminal 20 is effectively coupled with Q3 as a second slave mirroring transistor. The output current available at terminal 45 is related to $I_1$ as the ratio, H, of the effective area of the base-emitter junction of Q5 to that of Q3, supposing Q3 and Q5 to have similar doping profiles.

Potential follower transistor Q2 has its collector direct coupled to terminal 20 for conducting collector current. The Q2 collector current, however, contains a signal component by virtue of Q1 and Q2 having a common connection to current source $I_{S1}$. Current $I_{S1}$ is chosen in excess of current $I_1$, the excess being conducted in Q2 as $I_2$, that is $I_{S1} = I_1 + I_2$. Therefore, any change in $I_1$, due to imposition of signal potential across the base-emitter junction of Q1, is accompanied by an equal current change of opposite polarity in $I_2$. As a result, output signal can be obtained from the collector electrode of Q2 by interposing a load means between it and terminal 20.

Despite this amplifier configuration having a direct coupled input connection, the need for a capacitor in the circuit has not been eliminated. However, the output impedance levels of $I_{S2}$ and Q4 are relatively high in present day integrated circuits making possible the use of relatively low value capacitors, $C_1$, for relatively low value frequencies. For certain applications the entire amplifier including the capacitor can be integrated on the same monolithic die.

The circuit of FIG. 2 is an embodiment of the invention more particularly suited to linear analog signal amplification which takes advantage of the following facts: (a) the collector currents $I_1$ and $I_2$ of Q1 and Q2 contain differentially related signal components, and (b) the collector currents of master and slave current mirror transistors Q1 and Q5 contain differentially related signal components. A connection 14 between the collector electrodes of Q2 and Q5 will then sum the signal components of their collector currents, for supplying base drive to an ensuing common-emitter transistor Q6, for example. By making $I_{S1}$ equal to $(H+1)/G$ times $I_{S2}$, the quiescent components of the collector currents of Q2 and Q5 tend to cancel each other out.

In FIG. 2 like-conductivity-type transistors Q1 and Q2 having their emitter electrodes connected to node 11 for receiving current from current source $I_{S1}$ are configured similar to a long tailed pair designated 26. In the usual circumstance where Q1 and Q2 are monolithically integrated with the same dimensions and so have matched characteristics these transistors pass equal currents $I_1$ and $I_2$ for like potentials applied to their base electrodes. For dissimilar base potentials the current $I_{S1}$ divides between Q1 and Q2 in a ratio exponentially related to the difference in potentials.

In applying the amplifier stage of FIG. 1 or FIG. 2 to a pulse application, the amplitudes of currents $I_1$ and $I_2$ respectively conducted by transistors Q1 and Q2 are made substantially different to the extent of having substantially all of current $I_{S1}$ being conducted by Q1 or Q2 but further requiring that neither Q1 nor Q2 be in saturation nor in cut-off. The majority of current is conducted in Q1 or Q2 respectively for positive or negative going pulse signals. Since pulsed signals are usually unipolar, i.e., they swing in only one direction from a quiescent level, and since linearity of response is generally relatively unimportant, a wider range of bias potentials can be accommodated without affecting amplifier response. Consider a negative-going pulse applied to terminal 30 having sufficient amplitude to increment current $I_1$ by 75 percent of $I_{S1}$. If currents $I_1$ and $I_2$ are equal, insufficient current (only 50 percent of $I_{S1}$) is available to satisfy the demand of Q1, forcing Q1 into saturation and thereby slowing its frequency response. Alternatively if, at quiescence, Q1 is conducting substantially none of the $I_{S1}$ current, and the input amplitude is sufficient to increase $I_1$ by 75 percent of the current from $I_{S1}$, sufficient current can be diverted from Q2 to satisfy Q1 without Q1 saturating.

For pulsed applications it is desirable that the charging (discharging) rate of capacitor C1 be faster than the discharging (charging) rate which condition is achieved by choosing the current supplied by $I_{S2}$ to be greater (less) than the current output of the collector electrode of Q4. Application of an input pulse tends to bring currents $I_1$ and $I_2$ toward a balanced condition and in so doing provide an output pulse. Amplifier gain is generally sufficiently large that a maximum output pulse swing is obtained from less than the entire input pulse swing. Where the foregoing conditions are met, the potential on C1 is caused to follow the input potential relatively rapidly, presenting a moving bias point on the base of potential follower Q2, which attempts to restore currents $I_1$ and $I_2$ to their quiescent values and insure that Q1 and/or Q2 remain out of saturation. The potential on C1 must not follow too rapidly, otherwise, no output signal will be available, or the peak of the output will slew toward the quiescent value. There are trade-offs involved in the particular design which include pulse duration, expected pulse rate, probability of device saturation, delay time, etc.

The charge (discharge) rate of C1 for the period following the trailing edge of the input pulse is made slower to provide a maximum potential at the base of Q2 for rapidly restoring the currents $I_1$ and $I_2$ to their quiescent state. At the time the input pulse is removed node 15 will have obtained a potential tending to restore $I_1$ and $I_2$ in the presence of the input pulse. Therefore, when the input pulse is removed both Q1 and Q2 are biased to restore $I_1$ and $I_2$ to quiescence, enhancing the rate of transition of the trailing edge of the output pulse.

The amplifier as applied to pulsed systems is similar to the emitter coupled logic (ECL) family, but the present invention has a moving reference or bias as opposed to the fixed reference potential associated with ECL circuits, permitting the amplifier to function without the delays associated with charge storage in the base region of a transistor in saturation.

The circuit of FIG. 3 is similar to the circuit of FIG. 2 except that respective transistors Q1, Q2, Q3, Q4 and Q5 in the FIG. 2 circuit have been replaced by respective transistor pairs Q1'-Q11, Q2'-Q12, Q3'-Q13, Q4'-Q14 and Q5'-Q15, and the current sources $I_{S1}$ and $I_{S2}$ are shown replaced by the collector output currents $I_{S1}'$ and $I_{S2}'$ from multiple collector transistor Q20. The basic operation of the FIG. 2 and 3 circuits is the same. The use of transistor pairs, however, enhances various circuit parameters by reason of the beta multiplication afforded by the first transistor of each pair, driving its respective paired transistor.

Transistor pair Q1'-Q11 provides beta multiplication at the input yielding a higher circuit sensitivity coupled with higher input impedance. Transistor pair Q2'-Q12 are included to match the Q1'-Q11 transistors in the modified long tailed pair configuration in the balanced system and otherwise to minimize the base current present at the integrating capacitor. Variations in base current which flows from the potential follower to node 16 tend to upset the $I_{S2}$ current source-CMA balance. The addition of Q12 reduces the base current and concomitant variations at that node by a factor equal to the forward current gain of the transistor Q12.

Implementing transistor pairs Q3'-Q13, Q4'-Q14 and Q5'-Q15 in the current mirror amplifier configuration 25' and the balanced to single ended output, reduces the amount of current diverted from the mirror input current $I_1'$ required to bias the respective base-emitter circuits of the mirror transistors, thereby increasing the accuracy of the input/output current ratios of the respective current mirrors. These objectives may also be accomplished by using FET's or FET's cascaded with bipolar transistors in that the FET's draw no current on their control electrodes.

Transistor Q15 of transistor pair Q5'-Q15 has its collector connected to supply terminal 10 to provide excess current drawn by the base electrode of Q5' when its collector current $I_2'$ is near zero. This condition accrues for a relatively large, negative going signal applied to input 30 tending to increase current $I_1'$. Current mirror 25' attempts to mirror $I_1'$ in the collector path of Q5'; however, due to an imbalance in $I_1'$, $I_2'$, there is little or no current $I_2'$ available to satisfy the collector of Q5'. The base-emitter potential of Q5', which is proportional to collector-emitter current, is lowered by the lack of collector current with the effect of lowering its base impedance. The base electrode will tend to conduct an amount of current which is not available in $I_1'$. A similar condition would exist in Q15 if its collector were in a connection with the collector of Q5' similar to the connection of the collector of Q3' with that of Q13. Transistor Q15 has its collector electrode connected to supply terminal 10 to receive an unlimited supply of current, so Q15 is not subject to a lowering of its base impedance by reason of a lack of collector current and will supply the excess current conducted at the base electrode of Q5'. This prevents the occurrence of non-linearities that might occur in the amplifier due to a diversion of $I_1'$ current to the base electrode of Q15 if it were collector current starved.

The current sources $I_{S1}'$ and $I_{S2}'$ are shown in FIG. 3 as formed by lateral pnp transistor Q20 having two collector electrodes 21 and 22. A constant bias potential or a constant base current is applied to the base of Q20 to forward bias its base emitter junction causing essentially constant collector current to flow in both collectors 21 and 22. The ratio of the collector currents $I_{S1}':I_{S2}'$ is a function of the geometric ratio of the collector base junction regions 21 and 22 as is known in the art.

One skilled in the art and armed with the foregoing disclosure may conceive of variations on the embodiments shown without deviating from the spirit of the invention. For example, embodiments shown and described are in terms of bipolar transistors, but they may also be implemented with field effect transistors or a combination of bipolar and field effect transistors and the claims should be construed accordingly.

What I claim is:

1. An amplifier comprising:

first transistor means of a first conductivity type, said first transistor means having first and second electrodes defining the ends of a principal current conduction path and having a third electrode, potential between the first and third electrodes of said first transistor means controlling the conduction of current between its first and second electrodes for determining an output signal from said amplifier;

means for applying an input signal superimposed upon a quiescent potential to the third electrode of said first transistor means;

first current supply means for supplying a first current $I_1$ to a first node, to which the first electrode of said first transistor means is connected, said first current being a unidirectional current of a first polarity that will be conducted by the principal current conduction path of said first transistor means; and means for adjusting the potential applied to the first electrode of said first transistor means to regulate the amount of said first current that will be conducted by the principal current conduction path of said first transistor means thereby establishing an operating point for said first transistor means that is substantially independent of the quiescent potential which said input signal is superimposed upon, which means include:

potential follower means having an input connection and having an output connection to the first electrode of said first transistor means for establishing the potential at the first electrode of said first transistor means;

current mirror amplifier means having a current gain —G between an input terminal thereof to which the second electrode of said first transistor means connects and an output terminal thereof connected to a second node, G being a positive number;

constant current generator means for supplying a second current I₂ of said first polarity to said second node; and integrator means supplying a potential responsive to the integral of the difference between the quiescent values of said second current and the response at the output terminal of said current mirror amplifier means to the current flowing through the principal conduction path of said first transistor means to the input terminal of said current mirror amplifier means, thereby to develop a voltage applied to the input connection of said potential follower means.

2. An amplifier as set forth in claim 1 having a second transistor means of said first conductivity type, said second transistor means having first and second electrodes defining the ends of a principal current conduction path and having a third electrode; potential between the first and third electrodes of said first transistor means controlling the conduction of current between its first and second electrodes; and means arranging said second transistor means as said potential follower means with its third and first electrodes corresponding to the input and output connections, respectively, of said potential follower means.

3. An amplifier as set forth in claim 2 wherein an output signal current is taken from a third node to which the third electrode of said second transistor means connects.

4. an amplifier as set forth in claim 3 wherein said current mirror amplifier means is a plural-output-terminal current mirror amplifier means having a further output thereof connected to said third node.

5. An amplifier comprising:

a first terminal for applying a reference potential thereto;

a second terminal for applying a signal potential thereto;

first and second transistors of a first conductivity type each having first and second electrodes and a controlled principal current conduction path therebetween and having a control electrode, the conductivity of its principal current conduction path being controlled responsive to potential appearing between its first and control electrodes;

means connecting the control electrode of said first transistor to said second terminal, for receiving signal;

first current source means;

means connecting the first electrodes of said first and second transistors and said first current source means in a long tailed pair configuration, said current source poled to provide operating current to said long tailed pair configuration;

means connected between the second electrode of said second transistor and said first terminal for conducting the current passed in the principal conduction path of said second transistor;

current amplifier means, responsive to current conducted in the principal conduction path of said first transistor, from which an output current is available;

second current source means for providing an output of substantially constant current;

means connecting said current amplifier and said second current source for differentially summing their respective output currents and providing a difference current;

a capacitor connected for receiving and integrating said difference current, which difference current produces a balancing potential relating to the current conducted in the principal conduction path of said first transistor thereon; and means for applying said balancing potential to the control electrode of said second transistor.

6. An amplifier as set forth in claim 5 wherein the means connecting the control electrode of said first transistor to said second terminal comprises a third transistor of said first conductivity type having first and second electrodes and a controlled principal current conduction path therebetween and having a control electrode, the conductivity of its principal current conduction path being responsive to potential appearing between its first and control electrodes; said first, second and control electrodes of said third transistor respectively connected to the control electrode of said first transistor, to said first terminal, and to said second terminal; and wherein the means for applying said biasing potential comprises a fourth transistor of said first conductivity type having first and second electrodes and a controlled principal current conduction path therebetween and having a control electrode, the conductivity of its principal current conduction path being controlled responsive to potential appearing between its first and control electrodes; said first, second and control electrodes of said fourth transistor respectively connected to the control electrode of said second transistor, to said first terminal and to receive said balancing potential.

7. An amplifier as set forth in claim 5 or 6 wherein the current amplifier means comprises:

a current mirror amplifier having a gain G and having an inpunt and an output and a common electrode; said common electrode connected to said first terminal; said input electrode connected to the second electrode of said first transistor; and said output electrode connected to an output connection of said second current source.

8. An amplifier as set forth in claim 7 wherein the current mirror amplifier comprises:

fifth and sixth transistors of a second conductivity type complementary to said first conductivity type, each having first and second electrodes and a controlled principal current conduction path therebetween and having a control electrode, the conductivity of its principal current conduction path being controlled responsive to potential appearing between its first and control electrodes;

means connecting the control and second electrodes of said fifth transistor to the second electrode of said first transistor for receiving current therefrom;

means connecting the first electrodes of said fifth and sixth transistors to said first terminal;

means connecting the control electrode of said sixth transistor to the control electrode of said fifth transistor for receiving a control potential therefrom; and means connecting the second electrode of said sixth transistor to said second current source means.

9. An amplifier as set forth in claim 7 wherein said first and second constant current sources comprise:

a further transistor of said first conductivity type having a base electrode, an emitter electrode and first and second collector electrodes, with respective base-collector junctions; said further transistor passing substantially constant currents in said first and second collector electrodes responsive to a substantially constant potential applied between its base and emitter electrodes, the ratio of the current passed in the first and second collector electrodes being proportional to the geometric ratio of their respective base-collector junctions;

means connecting the base and emitter electrodes of said further transistor to a point of bias potential and said third terminal;

means connecting the first and second collector electrodes of said further transistor respectively to the first electrodes of said first and second transistors and the output electrode of said current mirror amplifier.

10. An amplifier as set forth in claim 7 further comprising:

a further transistor of said second conductivity type having first and second electrodes and a controlled principal current conduction path therebetween and having a control electrode, the conductivity of its principal current conduction path being controlled response to potential appearing between its first and control electrodes, means connecting the first and control electrodes of said further transistor respective to said first terminal and the second electrode of said first transistor;

a third terminal at which output signal is available;

means connecting the second electrode of said further transistor to said third terminal.

11. An amplifier as set forth in claim 7 wherein the current mirror amplifier comprises:

fifth, sixth, seventh and eighth transistors of a second conductivity type complementary to said first conductivity type, each having first and second electrodes and a controlled principal current conduction path therebetween and having a control electrode, the conductivity of its principal current conduction path being controlled responsive to potential appearing between its first and control electrodes; means connecting the first electrodes of said fifth and sixth transistors to said first terminal; means connecting the second electrodes of said fifth and seventh transistors to the second electrode of said first transistor; means connecting the second electrodes of said sixth and eight transistors to the output connection of said second current source; means connecting the first electrodes of said seventh and eight transistors to the respective control electrodes of said fifth and sixth transistors; means for direct coupling the second electrode of said first transistor to the control electrodes of said seventh and eighth transistors, whereby said fifth and seventh transistors form a composite master mirror transistor and said sixth and eighth transistors form a composite slave mirroring transistor.

12. A current amplifier as set forth in claim 11 wherein the means connected between the second electrode of said second transistor and said first terminal comprises;

ninth, tenth and eleventh transistors of said second conductivity type each having first and second electrodes and a controlled principal conduction path therebetween and having a control electrode, the conductivity of its principal conduction path being controlled responsive to potential appearing between its first and control electrodes;

a third terminal at which a potential, relatively positive with respect to the potential at said first terminal is available;

a fourth terminal at which an output signal is available;

means connecting the first electrodes of said tenth and eleventh transistors to said first terminal;

means connecting the first terminal of said ninth transistor to the control electrode of said tenth transistor;

means connecting the control electrodes of said ninth and eleventh transistors to the second electrodes of said first and second transistors respectively for receiving signal potentials;

means connecting the second electrodes of the ninth and eleventh transistors to said third terminal and said fourth terminal respectively; and means connecting the second electrode of said tenth transistor to the second electrode of said second transistor.

* * * * *